US007061176B2

(12) United States Patent
Kobayashi

(10) Patent No.: US 7,061,176 B2
(45) Date of Patent: *Jun. 13, 2006

(54) ELECTROLUMINESCENT DEVICE HAVING A THIN-FILM LAYER, AND ELECTRONIC DEVICE HAVING THE ELECTROLUMINESCENT DEVICE

(75) Inventor: Hidekazu Kobayashi, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/963,655

(22) Filed: Oct. 14, 2004

(65) Prior Publication Data

US 2005/0048320 A1 Mar. 3, 2005

Related U.S. Application Data

(63) Continuation of application No. 09/509,121, filed as application No. PCT/JP99/03978 on Jul. 23, 1999.

(30) Foreign Application Priority Data

Jul. 24, 1998 (JP) ................................ 10-210012
Jul. 16, 1999 (JP) ................................ 11-203632

(51) Int. Cl.
*H05B 33/00* (2006.01)

(52) U.S. Cl. ...................... 313/506; 313/503; 313/504; 428/690; 427/66

(58) Field of Classification Search ................ 313/498, 313/500–506; 428/690, 917
See application file for complete search history.

(56) References Cited

U.S. PATENT DOCUMENTS 5,247,190 A 9/1993 Friend et al. ................. 257/40
5,399,502 A 3/1995 Friend et al. .................. 437/1
5,739,635 A 4/1998 Wakimoto .................. 313/504
5,742,129 A 4/1998 Nagayama et al. ......... 315/167
5,747,182 A 5/1998 Friend et al. ............... 428/690
5,773,931 A 6/1998 Shi et al. ..................... 313/509
5,962,970 A 10/1999 Yokoi et al. ................ 313/506
6,111,356 A 8/2000 Roitman et al. ............ 313/506
6,121,727 A 9/2000 Kanai et al. ................ 313/504
6,188,176 B1 2/2001 Nakaya et al. .............. 313/504
6,221,563 B1 * 4/2001 Hryhorenko et al. ....... 430/315
6,312,304 B1 11/2001 Duthaler et al. ............. 445/24
6,322,910 B1 11/2001 Arai et al. .................. 428/690
6,326,726 B1 12/2001 Mizutani et al. ............ 313/504

(Continued)

FOREIGN PATENT DOCUMENTS

JP A 4-500582 1/1992

(Continued)

OTHER PUBLICATIONS

Wakimoto et al.; "Organic EL Cells Using Alkaline Metal Compounds as Electron Injection Materials", Aug. 1997, pp. 1245-1248, *IEEE Transactions On Electron Devices*, vol. 44, No. 8.

(Continued)

*Primary Examiner*—Karabi Guharay
*Assistant Examiner*—Sikha Roy
(74) *Attorney, Agent, or Firm*—Oliff & Berridge, PLC

(57) ABSTRACT

The invention provides an electroluminescent device having a structure that may include a light-emitting layer composed of, for example, at least an organic polymer between an anode and a cathode, and may also include a thin-film layer disposed between the light-emitting layer and the cathode, the thin-film layer suppressing unnecessary current which does not contribute to light emission.

16 Claims, 4 Drawing Sheets

U.S. PATENT DOCUMENTS

| | | | | |
|---|---|---|---|---|
| 6,575,800 | B1 | 6/2003 | Kobayashi et al. | 445/24 |
| 6,597,012 | B1 * | 7/2003 | Kido et al. | 257/40 |

FOREIGN PATENT DOCUMENTS

| | | |
|---|---|---|
| JP | A 5-3080 | 1/1993 |
| JP | 05-258859 | 10/1993 |
| JP | A 7-509338 | 10/1995 |
| JP | A 8-288069 | 11/1996 |
| JP | A 9-17574 | 1/1997 |
| JP | 10-036487 | 2/1998 |
| JP | A 10-36487 | 2/1998 |
| JP | A 10-153967 | 6/1998 |
| JP | A 10-289784 | 10/1998 |
| JP | A 11-26167 | 1/1999 |
| JP | 11-102787 | 4/1999 |
| JP | 11-191490 | 7/1999 |
| JP | 2000-040589 | 2/2000 |
| KR | 2001-23642 | 3/2001 |

OTHER PUBLICATIONS

L. S. Hung et al., "Enhanced Electron Injection in Organic Electroluminescence Devices Using An Al/LiF Electrode", Jan. 13, 1997, pp. 152-154, Apply. Phys. Lett. 70(2).

* cited by examiner

Bytron FILM THICKNESS vs. LIGHT-EMITTING CHROMATICITY

ELECTROLUMINESCENT DEVICE HAVING A THIN-FILM LAYER, AND ELECTRONIC DEVICE HAVING THE ELECTROLUMINESCENT DEVICE

This is a Continuation of application Ser. No. 09/509,121 filed Mar. 23, 2000, which is the National Stage of International Application No. PCT/JP99/03978 filed Jul. 23, 1999. The disclosure of the prior applications are hereby incorporated by reference herein in their entirety.

BACKGROUND OF THE INVENTION

1. Field of Invention

The present invention relates to structures of electroluminescent devices used for terminal components of information apparatuses, such as displays.

2. Description of Related Art

Among recent aggressive activities for developing next generation luminous displays to replace cathode ray tubes (CRT) and liquid crystal displays, research and development of plasma display panels (PDP), field-emission displays (FED), organic electroluminescent displays have been actively performed. In organic electroluminescent materials, organic polymer materials emitting blue, green, and orange light, have been developed to such a level that the initial characteristics thereof can be utilized (The Society of Fiber Science and Technology, Japan, Symposium Abstracts 1998, 3A11, etc.). Polyfluorene derivatives have been well known as polymer materials for blue light emission, as described in Japanese Journal of Applied Physics, Vol. 30, No. 11B, November, 1991, pp. L1941–L1943. In addition, as light-emitting materials having wavelengths of green or longer, poly(p-phenylenevinylene) derivatives have been well known, as described in U.S. Pat. No. 5,247,190.

Meanwhile, in electroluminescent devices using light-emitting materials having low molecular weights, it has been reported in Appl. Phys. Lett., 70, 152 (1997) that electron injection efficiency was improved by providing a cathode interface layer.

However, concerning organic polymer materials for blue light emission, even though the initial characteristics thereof can be satisfactory, there is the problem in that the wavelength of the luminescent color shifts toward the longer wavelength side with current-application time.

In addition, in electroluminescent devices using organic polymer materials as light-emitting materials, impurities exist therein due to difficulties in purifying organic polymers, and current which does not contribute to light emission flows through these impurities, whereby there is a problem in that sufficient efficiency cannot be obtained.

Furthermore, in a process for manufacturing electroluminescent devices, printing defects may occur when a printing method, specifically, an ink-jet method, is used as a method for forming a light-emitting layer, and electrical short circuits caused by the printing defects may occur, whereby there is a problem in that display may be disabled.

SUMMARY OF THE INVENTION

Taking the problems described above into consideration, the object of the present invention is to provide element configurations of electroluminescent devices using organic polymer materials, and more preferably, organic polymer materials for blue light emission as light-emitting materials, in which changes of luminescent color upon current application are suppressed and reliability is improved. In addition, the present invention provides element configurations capable of achieving satisfactory efficiency by suppressing unnecessary current, and provides element configurations capable of achieving satisfactory efficiency even for electroluminescent devices using organic polymer materials having wavelengths of green or longer. Furthermore, in a process for manufacturing display apparatuses by using a printing method, specifically, by using an ink-jet method, another object of the present invention is to prevent electrical short circuits at printing defects that may occur depending on the conditions.

According to the present invention, the electroluminescent devices described below are provided.

(1) An electroluminescent device having a structure that may include a light-emitting layer including at least an organic polymer and disposed between an anode and a cathode, and may also include a thin-film layer disposed at a position between the light-emitting layer and the anode, and/or between the light-emitting layer and the cathode. The thin-film layer suppresses unnecessary current which does not contribute to light emission.

According to the electroluminescent device described above, changes of luminescent color with current-application time can be effectively suppressed, and the reliability can therefore be noticeably improved. In addition, simultaneously, the insulating thin-film layer effectively blocks current passing through impurities existing in the organic polymer, and light-emitting efficiency is therefore improved.

Furthermore, in the present invention, configurations described below are provided as preferable embodiments.

(2) In the electroluminescent device described in (1) above, the organic polymer performs light emission in the wavelength range of 400 nm to 600 nm.

According to this configuration, an effect of improving the light-emitting efficiency described above can be obtained, specifically in the blue region and the vicinity thereof.

(3) In the electroluminescent device described in (1) or (2) above, the thin-film layer is disposed between the cathode and the light-emitting layer.

According to the configuration described above, unnecessary electron trap levels formed by joining the cathode and the light-emitting layer composed of, for example, the organic polymer at the interface thereof, can be avoided.

(4) In the electroluminescent device described in one of (1) to (3) above, the thin-film layer is composed of, for example, at least one material selected from the group consisting of, for example, a fluoride or an oxide of an alkali metal; a fluoride or an oxide of an alkaline earth metal; and a fluoride or an oxide of a group III element in the periodic table.

According to the configuration described above, the thin-film layer can be readily formed by a deposition method, and due to the characteristics thereof, specifically, changes of luminescent color with time are effectively suppressed, unnecessary current is suppressed, and light-emitting efficiency can therefore be improved.

(5) In the electroluminescent device described in (1) or (2) above, the thin-film layer is disposed between the anode and the light-emitting layer.

According to the configuration described above, hole trap levels formed by joining the anode and the light-emitting layer composed of, for example, the organic polymer can be avoided.

(6) In the electroluminescent device described in (1) or (2) above, a (positive) hole injection layer or a buffer layer having electrical conductivity, in which the thickness thereof is not less than 100 nm, is disposed between the light-emitting layer and the anode.

According to the configuration described above, changes of luminescent color with time after current-application are greatly and effectively decreased.

(7) In the electroluminescent device described in (1) or (2) above, the organic polymer is polyfluorene or a derivative thereof.

According to the configuration described above, the effect of the thin-film layer can be maximized specifically for blue light emission, and changes of luminescent color with time are greatly and effectively decreased.

(8) In the electroluminescent device described in (1) or (2) above, the organic polymer is poly(p-phenylenevinylene) or a derivative thereof.

According to the configuration described above, the light-emitting efficiency of the device for blue light emission can be noticeably improved.

(9) In the electroluminescent device described in (1) or (2) above, the degree of polymerization of the organic polymer is at least two.

According to the configuration described above, film formability of the light-emitting layer is improved, and improvements in reliability and characteristics are further achieved by disposing the thin-film layer.

(10) In the electroluminescent device described in (1) or (2) above, the light-emitting layer is formed by depositing a plurality of light-emitting material layers.

According to the configuration described above, an adjustable range for luminescent colors can be remarkably widened, and simultaneously, improvements in light-emitting efficiency and reliability can also be achieved.

(11) In the electroluminescent device described in (1) or (2) above, the light-emitting layer composed of, for example, the organic polymer is formed by a printing method.

According to the configuration described above, since the printing method, which is a very simple film-forming method, is used, and due to the provision of the thin-film layer, the probability of the occurrence of electrical short circuits is low even when printing defects exist, and display apparatuses having an exceedingly low probability of the occurrence of displaying defects can be obtained.

(12) In the electroluminescent device described in (11), the printing is an ink-jet method.

According to the configuration described above, the probability of the occurrence of electrical short circuits is low, even when printing defects caused by the ink-jet method exist, and display apparatuses having an exceedingly low probability of the occurrence of displaying defects can be manufactured.

In addition, as a specifically preferable embodiment, the present invention provides an electroluminescent device having a structure that may include a light-emitting layer composed of, for example, at least an organic polymer and disposed between an anode and a cathode, in which a layer composed of, for example, a fluoride of an alkali metal, an alkaline earth metal, or a group III element in the periodic table, is disposed between the light-emitting layer and the anode, and/or between the light-emitting layer and the cathode. In the devices described above, lithium fluoride is more preferably used as the fluoride.

DESCRIPTION OF THE PREFERRED EMBODIMENTS

Preferable embodiments for carrying out the present invention will be described in detail with reference to the examples.

EXAMPLE 1

In an electroluminescent device having a structure provided with an organic polymer and disposed between two electrodes (anode and cathode), one of which is transparent, according to this Example, an example will be described in which the organic polymer emits light in the wavelength range between 400 nm to 600 nm, and a thin-film layer is disposed between the organic polymer and the cathode.

Figure 1:
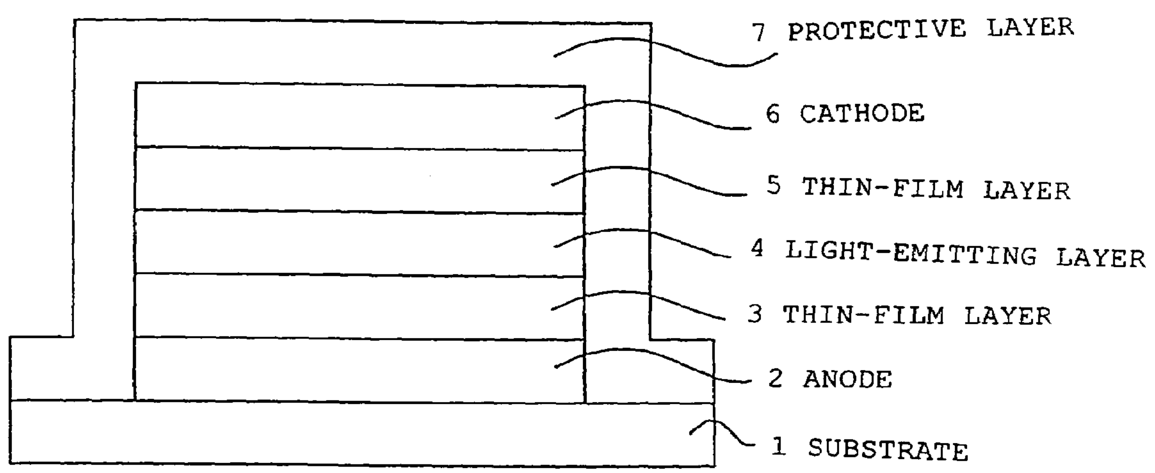
FIG. 1 is a cross-sectional view of the structure of an electroluminescent device according to Example 1 of the present invention.

In FIG. 1, a cross-sectional view of the electroluminescent device of the present invention is shown. As a transparent electrode (anode), an indium tin oxide (ITO) film was formed on a transparent glass substrate 1 and was then patterned. Next, as a (positive) hole injection layer (transport layer) to be used as a thin-film layer 3, a 100-nm thick film composed of, for example, Bytron (Bayer AG) was formed by coating followed by drying thereof. Then, a xylene solution containing one percent of poly(dioctyl)fluorene was coated and dehydrated, and a 50-nm thick film thereof was obtained as a light-emitting layer 4. Subsequently, an ethyl acetate solution containing polymethylmethacrylate (PMMA) was coated and dehydrated, and a 5-nm thick film thereof was obtained as a thin-film layer 5. Calcium was deposited to a thickness of 100 nm as a cathode 6, and aluminum was then deposited to a thickness of 300 nm. Next, the unit thus formed was encapsulated by using a protective substrate and an encapsulating agent composed of, for example, ultraviolet-cured materials (ultraviolet curable epoxy resin).

Figure 2:
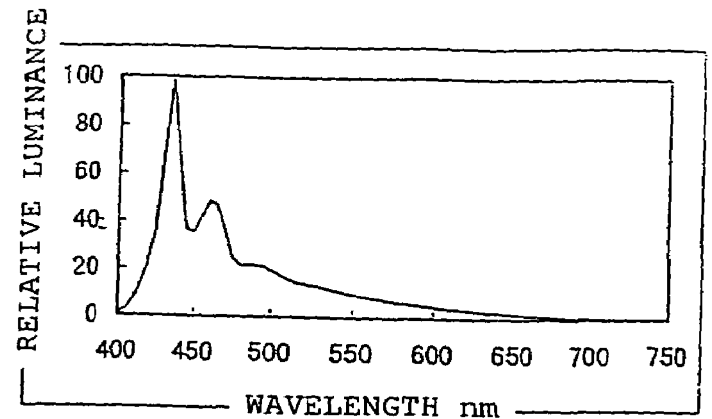
FIG. 2 shows a light emission spectrum of the electroluminescent device according to Example 1 of the present invention.

The light emission spectrum of the light-emitting device (blue light-emitting device) thus prepared is shown in FIG. 2. The light-emitting efficiency thereof was 0.1 lm/W.

In this example, a polyfluorene derivative was used as the light-emitting layer 4; however, any material which emits blue light has the same effect.

After forming and patterning the ITO film, when formation of banks for isolating the cathodes and subsequent formation of layers thereon are performed, patterning of films composed of, for example, a cathode material is not specifically required. Meanwhile, without forming the banks thus mentioned, a cathode pattern may also be formed by patterning using a physical mask during cathode deposition.

When active elements, such as thin-film transistors (TFT), are formed on the glass substrate 1 beforehand, a large-scale displaying may be readily performed.

In this example, PMMA was used as the thin-film layer 5; however, an organic polymer having insulating properties, such as polyethylene, may be used in a manner similar to that described above. In addition, an inorganic material having insulating properties, such as silicon dioxide, may be used as well. Concerning film formation, as well as a coating method, a deposition method or the like may also be employed.

In this example, ITO was used as the transparent electrode (anode); however, a transparent conductive material, such as IDIXO (Idemitsu K.K) and a NESA film, may also be used.

In this example, a glass substrate was used; however, a transparent substrate, such as a plastic, may also be used.

In this example, Bytron was used as the hole injection layer (transport layer) to be the thin-film layer 3; however, a material having electrical conductivity, such as polyaniline and a phthalocyanine compound, and an insulating material having a hole injection property, such as a phenylamine derivative of star-burst molecules, may also be used.

In this example, calcium was used as the cathode; however, a material having a small work function, such as lithium, magnesium, aluminum, and alloys thereof, may be used as well. Meanwhile, a material having a larger work function compared to that of a transparent electrode may be used by adjusting a driving voltage.

In this example, an ultraviolet cured material (ultraviolet curable epoxy resin) was used as the encapsulating agent; however, an encapsulating agent composed of, for example, a thermosetting resin having superior gas barrier properties and humidity resistance, may be used as well.

COMPARATIVE EXAMPLE 1

Figure 3:
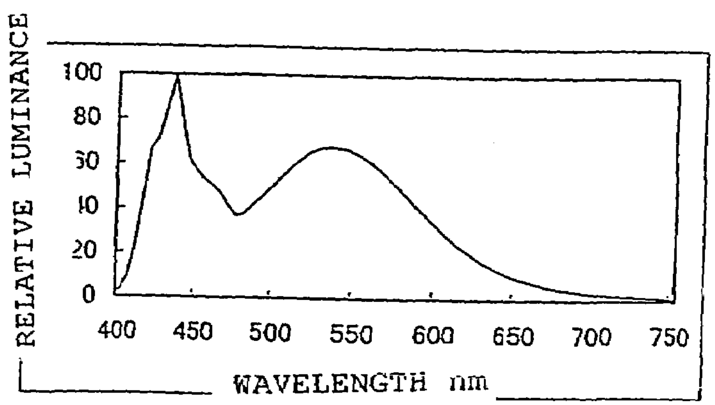
FIG. 3 shows a light emission spectrum of an electroluminescent device according to Comparative Example 1.

An electroluminescent device without having the thin-film layer 5 (the thin-film layer between the light-emitting layer and the cathode) of the structure shown in FIG. 1 of Example 1, was prepared. The light emission spectrum thereof is shown in FIG. 3. The light-emitting efficiency was 0.06 lm/W.

EXAMPLE 2

In this Example, an example will be described, in which a fluoride or an oxide of an alkali metal; a fluoride or an oxide of an alkaline earth metal; or a fluoride or an oxide of a group III element in the periodic table, is used for the thin-film layer of the structure shown in FIG. 1.

Figure 4:
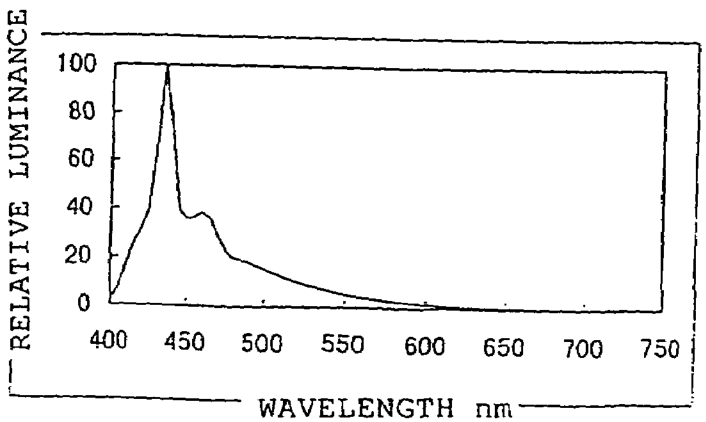
FIG. 4 shows a light emission spectrum of an electroluminescent device according to Example 2 of the present invention.

Formation methods for layers other than the thin-film layer were the same as described in Example 1. As the thin-film layer 5, calcium fluoride film formed by deposition to a thickness of 2 nm was used. The light emission spectrum of the light-emitting device (blue light-emitting device) thus prepared is shown in FIG. 4. The light-emitting efficiency was 0.17 lm/W.

In this example, calcium fluoride was used by deposition as the thin-film layer; however, lithium fluoride may also be used. In addition, a fluoride or an oxide of an alkali metal, such as lithium, sodium, or potassium; a fluoride or an oxide of an alkaline earth metal, such as beryllium, magnesium, calcium, or scandium; and a fluoride or an oxide of a group III element in the periodic table, such as boron, aluminum, or gallium, may also be used. In addition, a material that has adequate electrical insulating properties, easy film formability, and suppression of unnecessary current which does not contribute to light emission, may also be used.

EXAMPLE 3

In this Example, an example will be described in which poly(p-phenylenevinylene) or a derivative thereof is used as an organic polymer for the light-emitting layer. The structure of the Example other than an organic polymer layer (light-emitting layer) was equivalent to that of the light-emitting device described in Example 1.

As the light-emitting layer 4 (layer composed of, for example, an organic polymer) in FIG. 1, precursors of poly(p-phenylenevinylene) were coated and baked, and a 100-nm thick film was thereby obtained.

The light-emitting efficiency of the electroluminescent device thus prepared was 1.16 lm/W.

COMPARATIVE EXAMPLE 2

In Comparative Example 1, when a poly(p-phenylenevinylene) film was formed and used as the light-emitting layer (layer composed of, for example, an organic polymer) in a manner similar to that of Example 3, the light-emitting efficiency thereof was 0.4 lm/W.

EXAMPLE 4

In this Example, in the light-emitting device having the structure (Example 1) shown in FIG. 1, an example will be described in which a hole injection layer or a buffer layer having electrical conductivity, which is disposed between the light-emitting layer 4 and the anode 2 as the thin-film layer 3, was formed at various thickness.

Figure 5:
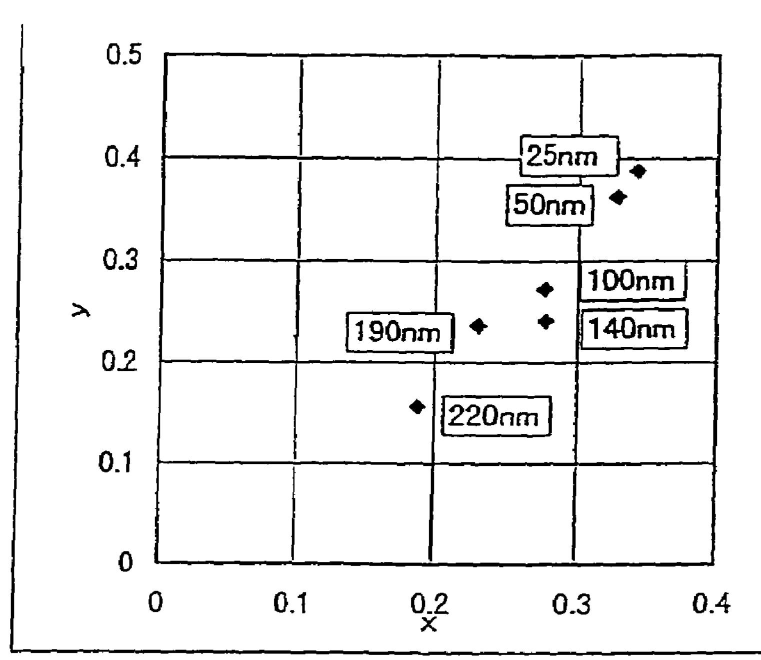
FIG. 5 shows the chromaticity of an electroluminescent device according to Example 4 of the present invention.

In Example 1, the electroluminescent devices were prepared by changing the thickness of the hole injection layers from 25 nm to 220 nm, and the chromaticities of these electroluminescent devices measured five minutes after current-application are shown in FIG. 5. It was clear that chromaticity shifting to a blue side could be obtained concomitant with an increase in the thickness of the buffer layer (specifically, not less than 100 nm).

EXAMPLE 5

In this Example, in the light-emitting device having the structure (Example 1) shown in FIG. 1, an example will be described in which the degree of polymerization of the organic polymer was changed. When the degree of polymerization was changed to 1, 2, and 1,000, film formability of an organic polymer having the degree of polymerization of 1 was seriously inferior. Meanwhile, concomitant with an increase of the degree of polymerization, superior film formability was obtained and an effect by inserting the thin-film layer was enhanced. Even when the degree of polymerization was 2, the effect by disposing the thin-film layer could be observed.

EXAMPLE 6

In this Example, an example, in which an ink-jet method was employed for forming the light-emitting layer, will be described.

Forming methods other than the formation of the light-emitting layer were equivalent to those described in Example 2. The formation of the light-emitting layer was performed by the ink-jet method. At the pixel on which the light-emitting layer could not be coated for some reason, a stacked layered structure composed of, for example, an ITO/a hole injection layer (transport layer) (Bytron of Bayer AG in this Example)/a thin-film layer (2 nm of LiF in this Example)/Ca/Al was formed. The measured current density of this structure was not greater than 1 $mA/cm^2$, and when the light-emitting layer was formed, the current density was a few tens of $mA/cm^2$. It is understood that current was suppressed when the light-emitting layer was not formed.

In this Example, the ink-jet method was described; however, other printing methods may also be used.

EXAMPLE 7

Figure 6:
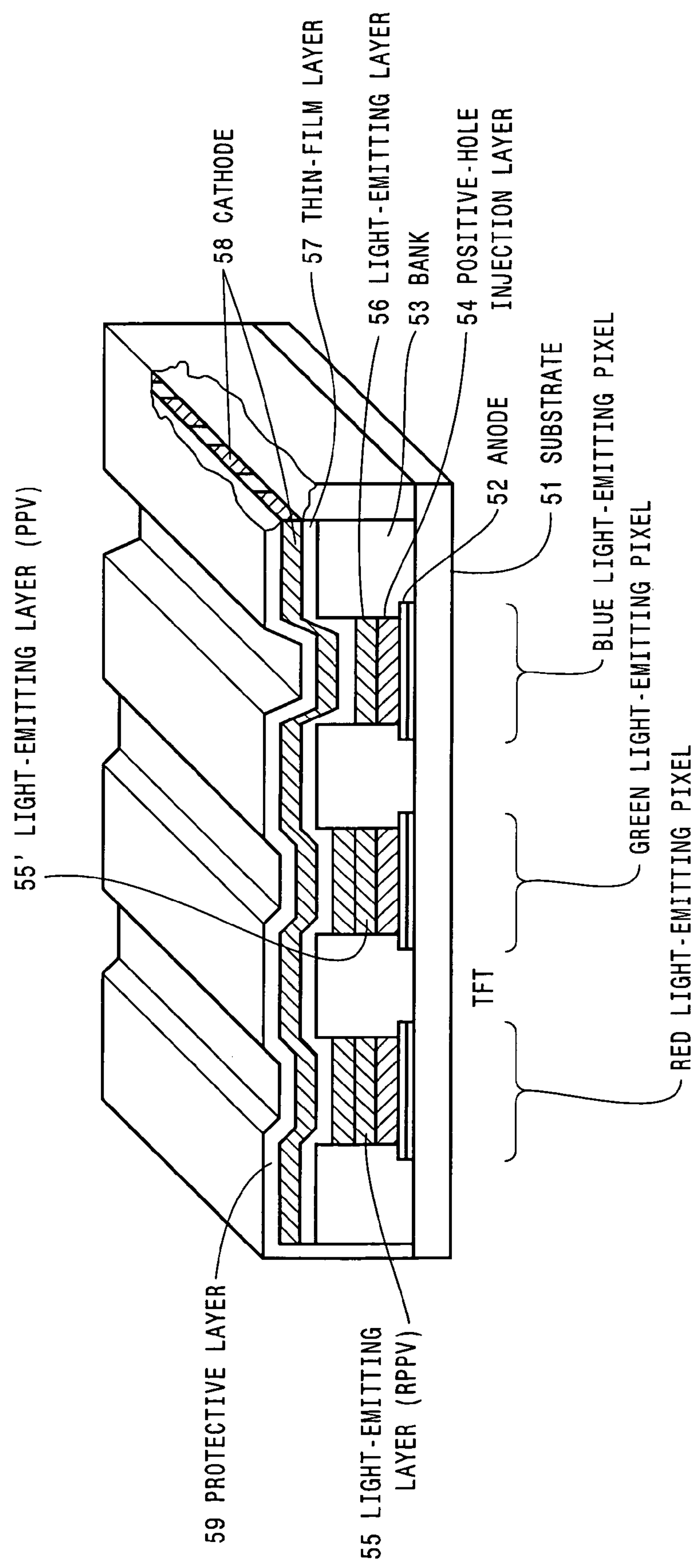
FIG. 6 is a cross-sectional view of the structure of an electroluminescent device according to Example 7 of the present invention.

In this Example, an example in which two light-emitting layers were formed will be described. In FIG. 6, the structure of an electroluminescent device of this Example is shown.

An anode group 52 was formed on a substrate 51, and subsequently, a bank 53 and a hole injection layer (transport layer) 54 (20-nm thick Bytron film by Bayer AG in this Example) 54 were formed. Next, on a pixel for red light emission, a solution containing precursors of poly(p-phenylenevinylene) doped with one percent of rhodamine 101 (RPPV) was coated as a first light-emitting layer (55) by an ink-jet method and then baked at 150° C. for 4 hours in $N_2$ atmosphere, and a 40-nm thick film was thereby obtained. Then, on a pixel for green light emission, a solution containing precursors of poly(p-phenylenevinylene) (PPV) was coated as a second light-emitting layer (55') by an ink-jet method and was then baked at 150° C. for 4 hours in $N_2$ atmosphere, and a 30-nm thick film was thereby obtained. On a pixel for blue light emission, nothing was coated by an ink-jet method. Subsequently, a xylene solution containing poly(dioctyl)fluorene was spin-coated on the entire pixels to a thickness of 45 nm as a third light-emitting layer (56). Next, a 2-nm thick film of lithium fluoride was formed by deposition over the entire surface of the substrate as a thin-film layer 57, and then a calcium film and an aluminum film were formed as a cathode 58 by deposition to a thickness of 100 nm and 200 nm, respectively. Over the unit thus prepared, a protective layer 59 was formed by a protective substrate and an encapsulating material. In addition, lead electrodes were connected to a controller circuit, whereby display was performed.

In the electroluminescent device thus prepared, the efficiency of the red light-emitting pixels was 0.15 lm/W, the efficiency of the green light-emitting pixels was 0.12 lm/W, and the efficiency of the blue light-emitting pixels was 0.18 lm/W.

A display panel (number of pixels was 320×240 and size was 2 inch) was made by forming a TFT device in each pixel of the substrate 51 beforehand. Electrical consumption was approximately 1.6 W and display luminance was 30 $Cd/m^2$, when an active matrix driving method displayed animation.

The thickness of each layer described in this Example is not limited thereto. In addition, the light-emitting materials are not limited to those described in this Example. When TFT arrays are formed on the substrate to be used, animation can be displayed. Meanwhile, when anodes and cathodes are formed as electrode groups in the form of stripes, and are disposed to orthogonally cross each other, simple matrix driving can be performed.

As described above in detail, according to the present invention, by disposing a thin-film layer, which suppresses unnecessary current which does not contribute to light emission, between a light-emitting layer composed of, for example, an organic polymer and a cathode, a tendency of the luminescent color to shift to longer wavelengths can be suppressed, and a light-emitting efficiency can be noticeably improved. In addition, even when defects of the light-emitting layer occur during a forming process therefor using a printing method or the like, electrical short circuits can be effectively prevented. Consequently, an organic electroluminescent (EL) display, which has consistent performance, a high light-emitting efficiency, and high color reproducibility, can be simply produced and can be provided, and the application thereof to information display apparatuses will therefore be accelerated.

INDUSTRIAL APPLICABILITY

The electroluminescent device according to the present invention can be suitably applied to electronic devices, such as lap-top type personal computers (PC) which are required to display high quality images, televisions, viewfinder type or direct-view monitor type video tape recorders, car navigation devices, electronic notebooks, electronic calculators, word processors, engineering work stations (EWS), mobile phones, video telephones, POS terminals, pagers, and apparatuses provided with touch panels.

What is claimed is:

1. An electroluminescent device, comprising:

a plurality of anodes and a plurality of cathodes above a substrate; and a plurality of light-emitting layers disposed between the plurality of the anodes and the plurality of the cathodes, each of the light-emitting layers including a polymer material, a thin-film layer being disposed between each of the cathodes and each of the light-emitting layers, the thin-film layer including at least one of a fluoride and an oxide of a metal element and being continuously formed so as to cover edge portions of the light-emitting layer.

2. The electroluminescent device according to claim 1, a material of the metal element in the thin-film layer being different from that of the plurality of cathodes.

3. The electroluminescent device according to claim 2, the at least one of a fluoride or an oxide of the metal element being at least one of a fluoride or an oxide of an alkali metal, a fluoride or an oxide of an alkaline earth metal, and a fluoride or an oxide of a group III element in the periodic table.

4. The electroluminescent device according to claim 3, a bank defining the plurality of the light-emitting layers to form a plurality of pixels.

5. The electroluminescent device according to claim 4, the metal element being included in the thin-film layer, the thin-film layer being disposed between a blue light emitting layer and the plurality of cathodes.

6. The electroluminescent device according to claim 5, the blue light emitting layer including a polyfluorene derivative.

7. The electroluminescent device according to claim 5, a degree of polymerization of the polymer material being at least 1.

8. An electroluminescent device, comprising:

a plurality of anodes and a common cathode above a substrate; and a plurality of light-emitting layers disposed between the plurality of the anodes and to cathode, the plurality of the light-emitting layers including a polymer material, a thin-film layer being disposed between the cathode and each of the light-emitting layers, the tin-film layer including at least one of a fluoride and an oxide of a metal element, the thin-film layer being continuously formed so as to cover edge portions of the light-emitting layer and sandwiched between the cathode a topmost surface of a bank.

9. The electroluminescent device according to claim 8, the material of the metal element in the thin-film layer being different from that of the cathode.

10. The electroluminescent device according to claim 9, the at least one of a fluoride or an oxide of the metal element being at least one of a fluoride or an oxide of an alkali metal, a fluoride or an oxide of an alkaline earth metal, and a fluoride or an oxide of a group III element in the periodic table.

11. The electroluminescent device according to claim 10, a bank defining the plurality of the light-emitting layers to form a plurality of pixels.

12. The electroluminescent device according to claim 11, the metal element being included in the thin-film layer, the thin-film layer being disposed between a blue light emitting layer and the cathode.

13. The electroluminescent device according to claim 12, the blue light emitting layer including a polyfluorene derivative.

14. The electroluminescent device according to claim 12, a degree of polymerization of the polymer material being at least 1.

15. A method for making an electroluminescent device, comprising:

forming a plurality of anodes above a substrate;

forming a plurality of light-emitting layers above the plurality of the anodes by a coating method, the plurality of the light-emitting layers including a polymer material;

forming a yhin-film layer above each of the light-emitting layers by a coating method so as to cover edge portions of the light-emitting layer, and forming a cathode above the thin-film layer, the thin-film layer being disposed between the cathode and each of the light-emitting layers, the thin-film layer including at least one of a fluoride and an oxide of a metal element, the thin-film layer being continuously formed so as to cover edge portions of the light-emitting layer, and sandwiched between the cathode and a topmost surface of a bank.

16. A method for making an electroluminescent device, comprising:

forming a plurality of anodes above a substrate;

forming a plurality of light-emitting layers above each of the plurality of anodes by a coating method;

forming a thin-film layer above each of the light-emitting layers by deposition so as to cover edge portions of the light-emitting layer; and forming a cathode above the thin-film layer, the thin-film layer being disposed between the cathode and each of the light-emitting layers, the thin-film layer including at least one of a fluoride and an oxide of a metal element, the thin-film layer being continuously formed as to cover edge portions of the light-emitting layer, and sandwiched between the cathode and a topmost surface of a bank.

* * * * *